United States Patent
Lee et al.

(10) Patent No.: US 9,230,967 B2
(45) Date of Patent: Jan. 5, 2016

(54) METHOD FOR FORMING SELF-ALIGNED ISOLATION TRENCHES IN SEMICONDUCTOR SUBSTRATE AND SEMICONDUCTOR DEVICE

(71) Applicant: INOTERA MEMORIES, INC., Taoyuan County (TW)

(72) Inventors: Tzung-Han Lee, Taipei (TW); Yaw-Wen Hu, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 14/251,765

(22) Filed: Apr. 14, 2014

(65) Prior Publication Data
US 2015/0171162 A1 Jun. 18, 2015

(30) Foreign Application Priority Data
Dec. 18, 2013 (TW) .............................. 102146985 A (51) Int. Cl.
*H01L 27/108* (2006.01)
*H01L 21/762* (2006.01)

(52) U.S. Cl.
CPC .... *H01L 27/10805* (2013.01); *H01L 21/76224* (2013.01); *H01L 27/10885* (2013.01)

(58) Field of Classification Search
CPC ................. H01L 2924/0002; H01L 27/11521; H01L 2924/00; H01L 27/115; H01L 29/7881; H01L 27/0207
See application file for complete search history.

(56) References Cited

U.S. PATENT DOCUMENTS 8,207,583 B2 * 6/2012 Juengling ...................... 257/390
2008/0265303 A1 * 10/2008 Kwon ............................. 257/315

* cited by examiner

*Primary Examiner* — Tony Tran
(74) *Attorney, Agent, or Firm* — Rosenberg, Klein & Lee (57) ABSTRACT

The instant disclosure relates to a method for forming self-aligned isolation trenches in semiconductor substrate, comprising the following steps. The first step is providing a semiconductor substrate defined a plurality of active areas thereon. The next step is forming at least two buried bit lines in each of the active areas and an insulating structure disposed above and opposite to the at least two buried bit lines. The next step is forming a self-aligned spacer on the sidewalls of each of the insulating structures. The last step is selectively removing the semiconductor substrate with the self-aligned spacers as masks to form a plurality of isolation trenches.

3 Claims, 8 Drawing Sheets

METHOD FOR FORMING SELF-ALIGNED ISOLATION TRENCHES IN SEMICONDUCTOR SUBSTRATE AND SEMICONDUCTOR DEVICE

BACKGROUND OF THE INVENTION

1. Field of the Invention

The instant disclosure relates to a method of forming insolating structures; in particular, to a method for forming self-aligned isolation trenches in semiconductor substrate.

2. Description of Related Art

Dynamic random access memory (DRAM) is an electronic data storage device. In DRAM, each bit of binary data is stored in a tiny circuit called a memory cell consisting of a transistor and a capacitor. Generally, the better operating capability of computer software becomes, the greater memory capacitance of computer hardware need. Thus, the method for manufacturing DRAM capacitors is now an indispensable technology.

With the vigorous development of semiconductor industry, the dimension of integrated circuit elements nowadays range from micron size to submicron size. For DRAM, that is to say the cross-sectional area of each capacitor and each gap between capacitors become smaller. The traditional method for patterning the target layer on the substrate comprises the following steps. A photoresist material is spin-coated on the target layer in the first place. The photoresist material is exposed and developed through a patterned mask to form a patterned photoresist layer in the second place. Further, a process of etching is conducted to pattern the target layer by using the patterned photoresist layer as the etch mask.

However, in view of the resolution of pattern transfer is increased and the critical dimension of the line width is reduced. Limitation exists for improving lithography by only optical improvement.

In addition, MIM (Metal insulator Metal) capacitors basically a parasitic capacitor between the metal layers. Generally three or more reticles are used in the processing steps. In order to overcome its complex process, the design of DRAM will focus on a reduction in the number of reticles used.

SUMMARY OF THE INVENTION

The object of the instant disclosure is to provide a method for forming self-aligned isolation trenches in semiconductor substrate. The instant method can reduce the reticle requirements as well as accurately place well-defined isolation trenches in the semiconductor substrate.

In order to achieve the aforementioned objects, according to an embodiment of the instant disclosure, a method for forming self-aligned isolation trenches in semiconductor substrate includes the following steps: providing a semiconductor substrate defined a plurality of active areas thereon; forming at least two buried bit lines in each of the active areas and an insulating structure disposed above and opposite to the at least two buried bit lines; forming a self-aligned spacer on the sidewalls of each of the insulating structures; selectively removing the semiconductor substrate with the self-aligned spacers as masks to form a plurality of isolation trenches.

In order to achieve the aforementioned objects, according to an embodiment of the instant disclosure, a semiconductor device is further provided. The semiconductor device includes a semiconductor substrate, a plurality of buried bit lines, a plurality of insulating structures, and a plurality of self-aligned spacers. The semiconductor substrate has a plurality of active areas defined thereon. The buried bit lines are disposed in the semiconductor substrate, wherein two of the buried bit lines are positioned in each of the active areas. The insulating structures are disposed on the semiconductor substrate, wherein each of the insulating structures is positioned on and opposite to the two of the buried bit lines. The self-aligned spacers are disposed on the sidewalls of the insulating structures respectively to partially expose the surface of the semiconductor substrate.

Based on the above, because the buried bit lines and the isolation trenches can be formed in the semiconductor substrate, the DRAM device having $4F^2$ size can be achieved. Moreover, the buried bit lines and the isolation trenches are formed via a self-aligned process which is used to substitute the lithography process. In other words, the buried bit lines and the isolation trenches can be accurately placed in the semiconductor substrate without any reticle. Hence, the instant method can reduce the reticle requirements to reduce the processing cost.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

The instant disclosure relates to a novel method for forming self-aligned isolation trenches in semiconductor substrate. The instant method not only can accurately place well-defined isolation trenches without any reticle, but also can help improve the alignment of the landing areas of capacitors and bit line contacts and buried bit line trenches. Hence, the instant method can increase the yield rate of DRAM modules.

Figure 1:
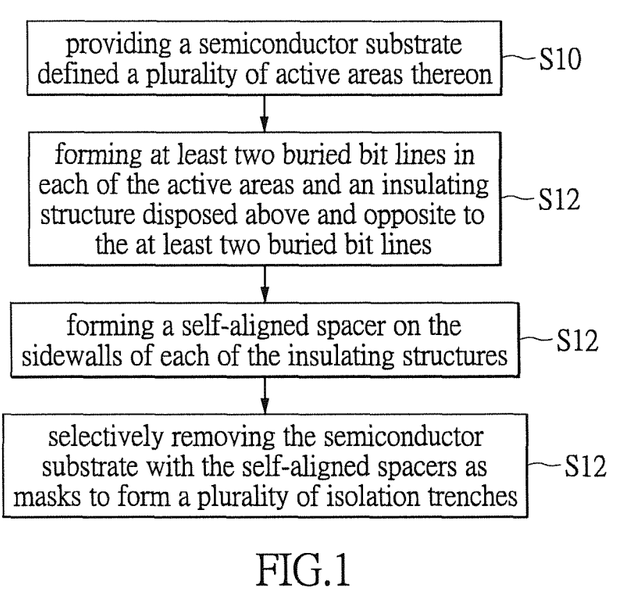
FIG. 1 shows a process flow diagram of a method for forming self-aligned isolation trenches in semiconductor substrate according to an embodiment of the instant disclosure.
Figure 2:
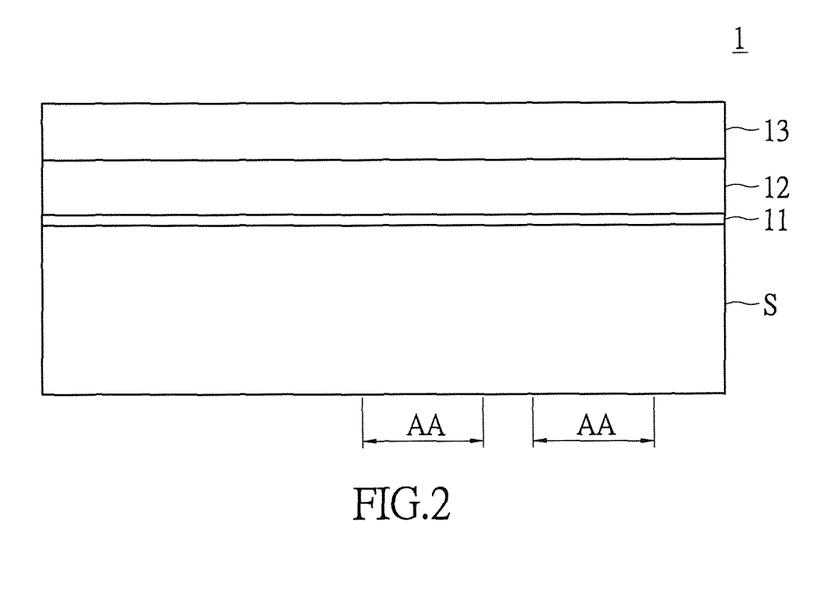
FIG. 2-7 are cross-sectional diagrams illustrating the processing steps of method for forming self-aligned isolation trenches in semiconductor substrate according to an embodiment of the instant disclosure.

Please refer to FIG. 1 as well as FIGS. 2-7. FIG. 1 is a process diagram of the method for forming self-aligned isolation trenches in semiconductor substrate. FIGS. 2-7 are cross-sectional diagrams illustrating the processing steps of the instant method. Following will describe the method for forming self-aligned isolation trenches in semiconductor substrate. Thus, the instant disclosure can be performed by any person skilled in the art when understanding its features. Basically, the method comprises the following steps:

Step 10 is providing a semiconductor substrate 1 defined a plurality of active areas AA thereon. Referring to FIG. 2, the step S11 further comprises, but not limited to, providing a substrate S, then sequentially forming a pad layer 11, a first mask layer 12, and a second mask layer 13 on the substrate S.

In practice, the substrate S can be a silicon substrate or any other suitable substrate. The pad layer 11 is made of oxide (pad oxide layer) or nitride (pad nitride layer). The first mask layer 12 and the second mask layer 13 are made of, but not limited to, silicon nitride and polysilicon respectively. In addition, the material of the first or second mask layers 12, 13 can be selected based on the etch selectivity either. For example, the material of the first or second mask layers 12, 13 is selected from the group consisting of silicon nitride, silicon oxide, and polysilicon.

Figure 1A:
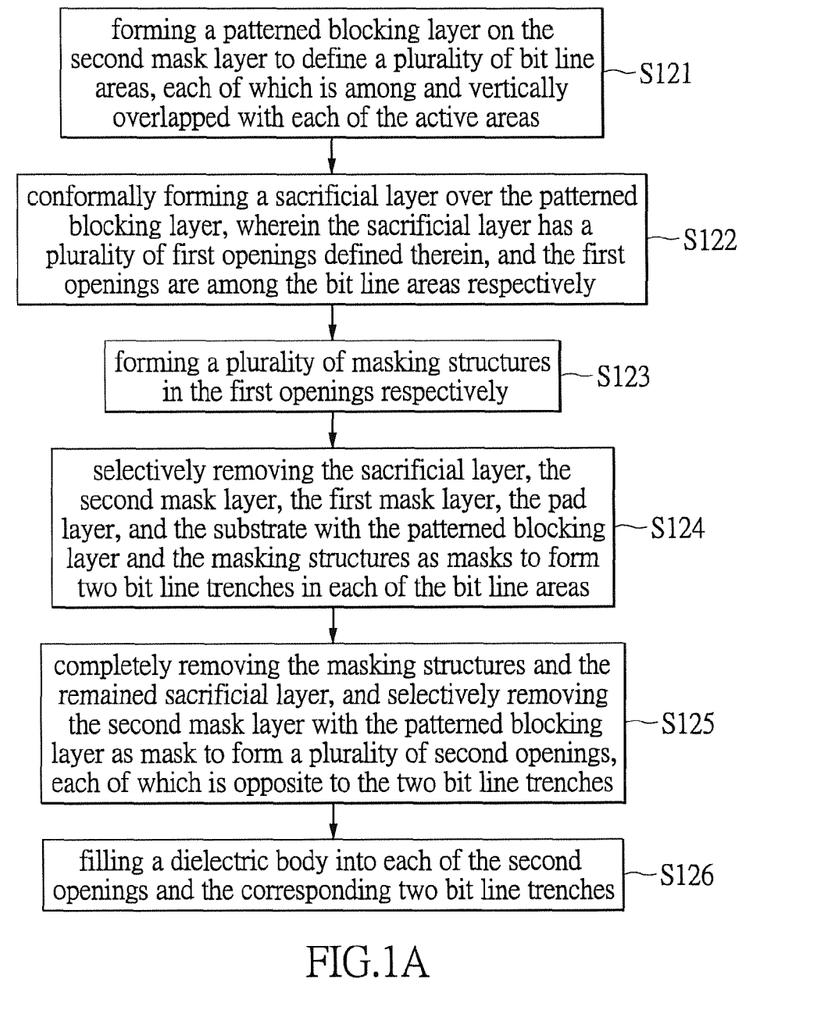
FIG. 1A shows a process flow diagram of a method for forming buried bit lines and insulating structures according to an embodiment of the instant disclosure.
Figure 3:
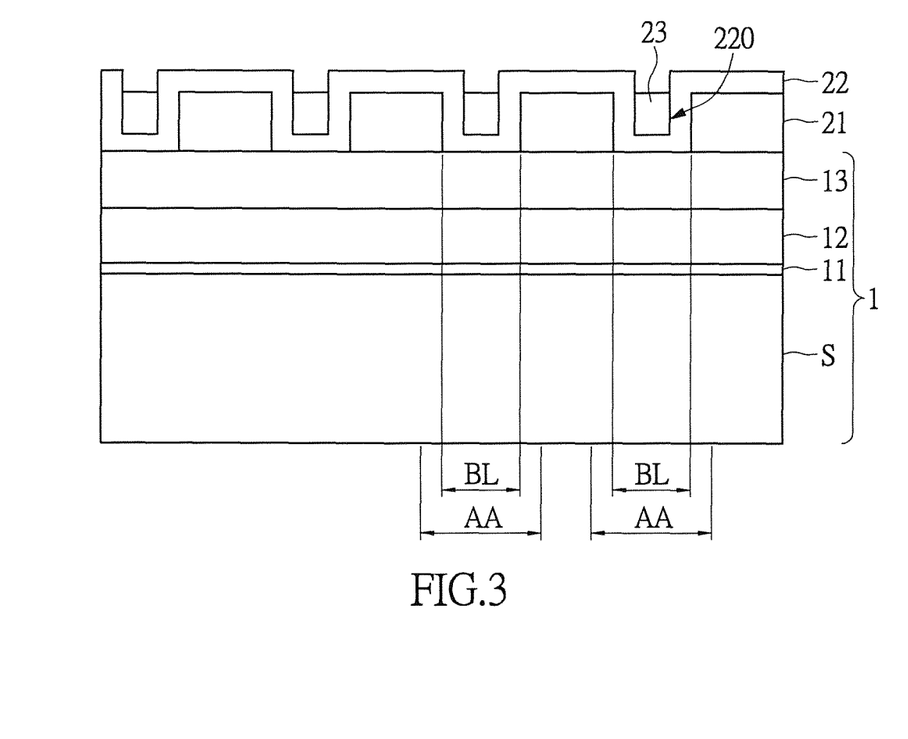
Figure 4:
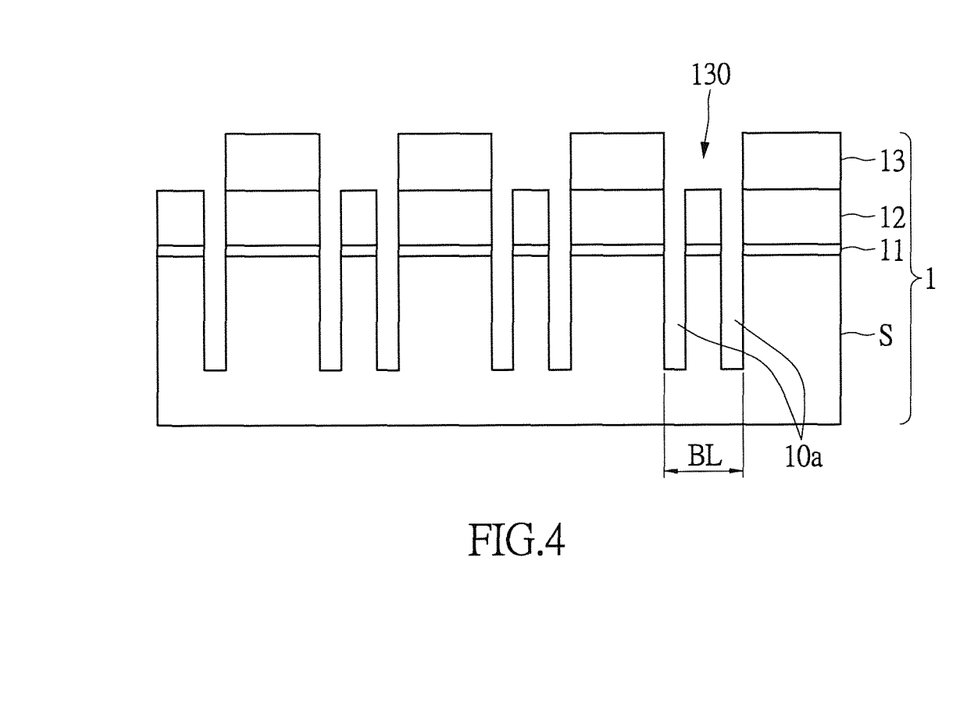
Figure 5:
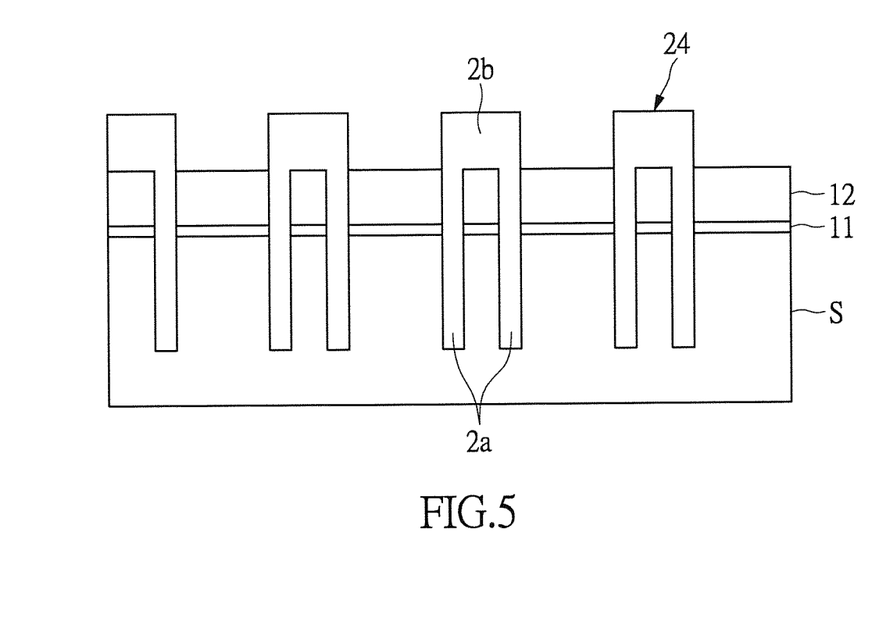

Referring to FIG. 1A as well as FIGS. 3-5, step S12 is forming at least two buried bit lines 2a in each of the active areas AA and an insulating structure 2b disposed above and opposite to the at least two buried bit line 2a. It is notable that the step S12 is a key step of the instant disclosure. Concretely speaking, the step S12 further comprises, but not limited to, the following steps. First, a process of deposition is conducted to form a blocking layer 21 over the second mask layer 13, and a process of partial etch is then conducted to pattern the blocking layer 21 to define a plurality of bit line areas BL (step S121). Specifically, each of the bit line areas BL is among and vertically overlapped with each of the active areas AA. Second, another process of deposition is conducted to form a sacrificial layer 22 that conformally covers the patterned blocking layer 21 (step S122). That is, the sacrificial layer 22 can define a plurality of first openings 220 therein, and the first openings 220 are among the bit line areas BL respectively.

Third, still another process of deposition is conducted to form a masking material over the patterned blocking layer 21 and fill the first openings 220, then a process of etch is conducted remove a portion of the masking material outside the first openings 220 to form a plurality of masking structures 23, and then a process of etch back is conducted to etch each of the masking structures 23 to have a desired thickness (step S123). Fourth, another process of partial etch is conducted to selectively remove the sacrificial layer 22, the second mask layer 13, the first mask layer 12, the pad layer 11, and the substrate S in order with the patterned blocking layer 21 and the masking structures 23 as self-aligned masks to form two bit line trenches 10a in each of the bit line areas BL (step S124).

After that, the masking structures 23 and the remained sacrificial layer 22 are completely removed, and still another process of partial etch id conducted to selectively remove the second mask layer 13 with the patterned blocking layer 21 as mask to form a plurality of second openings 130 (step S125). Specifically, each of the second openings 130 is opposite to the two bit line trenches 10a. Finally, a dielectric body 24 is formed to fill each of the second openings 130 and the corresponding two bit line trenches 10a (step S126). Consequently, there are two buried bit lines 2a in each of the bit line areas BL, and there is an insulating structure 2b disposed above and opposite to the at least two buried bit lines 2a.

In the step S120, the blocking layer 21 can be made of oxide rich material, and be patterned via a selective etch process. That is to say, a patterned photoresist layer (not shown) is formed to partially cover the surface of the blocking layer 21 in the first place. A process of etch is conducted to pattern the blocking layer 21 through the patterned photoresist layer in the second place. In the step S121, the sacrificial layer 22 can be made of silicon rich material such as silicon nitride, and be formed along topography via atomic layer deposition (ALD). In this way, the thickness of the sacrificial layer 22 can be controlled at sub-micron level, and the uni-formity of the sacrificial layer 22 can be improved. In the step S122, the masking structures 23 can be made of silicon rich material either.

Consequently, in the step S123, a portion of the sacrificial layer 22 made of silicon rich material and the semiconductor substrate 1 can be removed via a plasma etching process or a reactive ion etching process with the patterned blocking layer 21 and the masking structures 23 as self-aligned masks to form the bit line trenches 10a without any reticle. Specifically, the etching gas can be selected to exhibit high selectivity for silicon such as the mixing gas of HBr and $O_2$. Thus, over-etching effect on the other layer can be prevented in the etching process.

Figure 6:
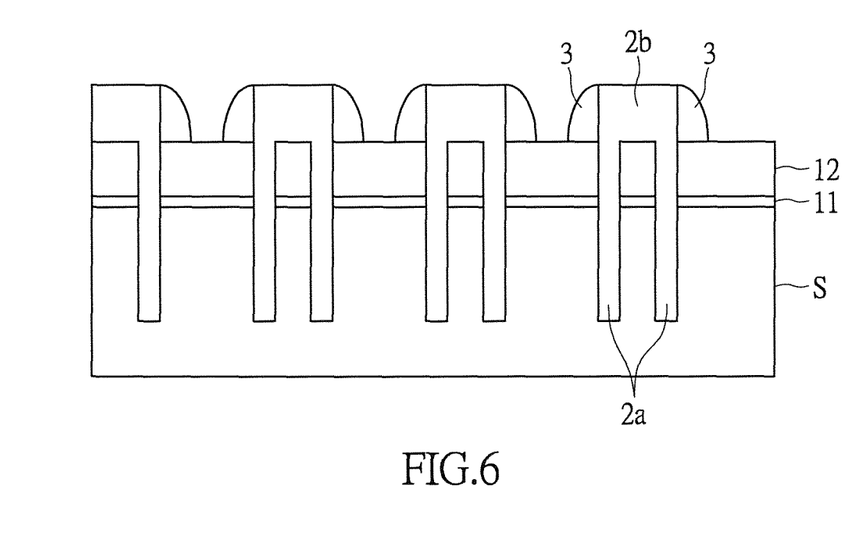

Referring to FIG. 6, step S14 is forming a self-aligned spacer 3 on the sidewalls of each of the insulating structures 2b. It is notable that the step S13 is another key step of the instant disclosure. In practice, the self-aligned spacers 3 can be made of silicon nitride, silicon oxide, or silicon carbon. Concretely speaking, the step S13 further comprises, but not limited to, the following steps. A spacer material (not shown) is conformally deposited over the semiconductor substrate 1 in the first place. Further, a process of etch back is performed on the spacer material to form the self-aligned spacers 3 to partially expose the surface of the semiconductor substrate 1.

Figure 7:
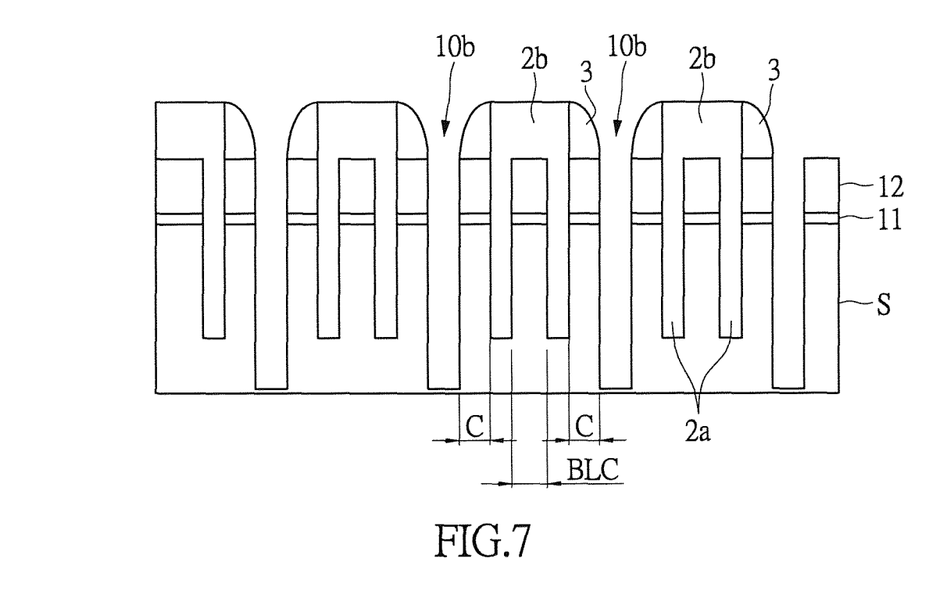

Referring to FIG. 7, step S16 is selectively removing the semiconductor substrate 1 with the self-aligned spacers 3 as masks to form a plurality of isolation trenches 10b that isolate the buried bit lines 2a in different active areas AA. Most importantly, the landing areas of capacitor and bit line contact C, BLC are defined while the formation of the isolation trenches 10b. For each active area AA, a landing area of bit line contact BLC is positioned between two buried bit lines 2a. Moreover, two landing areas of capacitor are positioned between each of the two buried bit lines 2a and the adjacent isolation trench 10b. Specifically, the dimension of each landing area of capacitor C can be adjusted according to the thickness of each self-aligned spacer 3.

Please refer to FIGS. 6 and 7 again, the technical features of the method for forming self-aligned isolation trenches in semiconductor substrate are mentioned above. So the instant disclosure further relates to a semiconductor device which includes a semiconductor substrate 1, a plurality of buried bit lines 2a, a plurality of insulating structures 2b, and a plurality of self-aligned spacers 3.

In this embodiment, the semiconductor substrate 1 has a plurality of active areas AA defined thereon. The buried bit lines 2a are disposed in the semiconductor substrate 1, wherein two of the buried bit lines 2a are positioned in each of the active areas AA. The insulating structures 2b are disposed on the semiconductor substrate 1, wherein each of the insulating structures 2b is positioned on and opposite to the two of the buried bit lines 2a. The self-aligned spacers 3 are disposed on the sidewalls of the insulating structures 2b respectively to partially expose the surface of the semiconductor substrate 1. By the way, the processing steps for forming the semiconductor substrate 1, the buried bit lines 2a, the insulating structures 2b, and the self-aligned spacers 3 are mentioned above. No attention is given to said processing steps.

Based on above, the instant method for forming self-aligned isolation trenches in semiconductor substrate, in comparison with the traditional one, has the following advantages.

Firstly, because the buried bit lines and the isolation trenches can be formed in the semiconductor substrate, the DRAM device having $4F^2$ size can be achieved. Moreover, the buried bit lines and the isolation trenches are formed via a self-aligned process which is used to substitute the lithography process. In other words, the buried bit lines and the isolation trenches can be accurately placed in the semiconductor substrate without any reticle. Hence, the instant method can reduce the reticle requirements to reduce the processing cost.

Further, the isolation trenches are formed through the self-aligned spacers. Thus, the instant method not only can simplify the processing steps, but also can prevent the offset of the landing areas of capacitor due to the misalignment of reticle or the smaller dimension. In this way, the instant method can increase the yield rate of the DRAM device and miniaturize the DRAM device.

Furthermore, the instant method can easily control the dimension of the landing areas of capacitor by setting the process parameters. Consequently, the uniformity of the subsequently formed capacitors can be improved.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method for forming self-aligned isolation trenches in semiconductor substrate, comprising the following steps:
   providing a semiconductor substrate defined a plurality of active areas thereon, wherein the step of providing a semiconductor substrate comprises:
      forming a pad layer on a substrate;
      forming a first mask layer on the pad layer; and
      forming a second mask layer on the first hard mask layer;
   forming at least two buried bit lines in each of the active areas and an insulating structure disposed above and opposite to the at least two buried bit lines, wherein the step of forming at least two buried bit lines in each of the active areas and an insulating structure disposed above and opposite to the at least two buried bit lines further comprises:
      forming a patterned blocking layer on the second mask layer to define a plurality of bit line areas, each of which is among and vertically overlapped with each of the active areas;
      conformally forming a sacrificial layer over the patterned blocking layer, wherein the sacrificial layer has a plurality of first openings defined therein, and the first openings are among the bit line areas respectively;
      forming a plurality of masking structures in the first openings respectively;
      selectively removing the sacrificial layer, the second mask layer, the first mask layer, the pad layer, and the substrate with the patterned blocking layer and the masking structures as masks to form two bit line trenches in each of the bit line areas;
      completely removing the masking structures and the remained sacrificial layer, and selectively removing the second mask layer with the patterned blocking layer as mask to form a plurality of second openings, each of which is opposite to the two bit line trenches; and
   filling a dielectric body into each of the second openings and the corresponding two bit line trenches;
   forming a self-aligned spacer on the sidewalls of each of the insulating structures; and
   selectively removing the semiconductor substrate with the self-aligned spacers as masks to form a plurality of isolation trenches.

2. The method for forming self-aligned isolation trenches in semiconductor substrate according to claim 1, wherein the step of forming a plurality of masking structures in the first openings respectively further comprises etching back each of the masking structures to a desired thickness.

3. The method for forming self-aligned isolation trenches in semiconductor substrate according to claim 1, wherein the step of forming a self-aligned spacer on the sidewalls of each of the insulating structures further comprises:
   conformally depositing a spacer material on the semiconductor substrate; and
   selectively removing the spacer material to form the self-aligned spacer on the sidewalls of each of the insulating structures via a dry etch-back process.

* * * * *